(12) United States Patent
Uchida et al.

(10) Patent No.: US 12,040,258 B2
(45) Date of Patent: Jul. 16, 2024

(54) SEMICONDUCTOR APPARATUS MOUNTED ELECTRICALLY CONNECTED TO A PLURALITY OF EXTERNAL TERMINALS BY A LEAD

(71) Applicant: SHINDENGEN ELECTRIC MANUFACTURING CO., LTD., Tokyo (JP)

(72) Inventors: Naoto Uchida, Saitama (JP); Yoshimasa Kobayashi, Saitama (JP); Toshikazu Arai, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 355 days.

(21) Appl. No.: 17/439,401

(22) PCT Filed: Mar. 25, 2019

(86) PCT No.: PCT/JP2019/012629
§ 371 (c)(1),
(2) Date: Sep. 15, 2021

(87) PCT Pub. No.: WO2020/194480
PCT Pub. Date: Oct. 1, 2020

(65) Prior Publication Data
US 2022/0148943 A1 May 12, 2022

(51) Int. Cl.
*H01L 23/495* (2006.01)
*H01L 23/00* (2006.01)
*H01L 23/31* (2006.01)

(52) U.S. Cl.
CPC .... *H01L 23/49503* (2013.01); *H01L 23/3107* (2013.01); *H01L 23/49524* (2013.01);
(Continued)

(58) Field of Classification Search
CPC ......... H01L 23/49503; H01L 23/49551; H01L 23/3107; H01L 23/49541; H01L 23/49524;
(Continued)

(56) References Cited

U.S. PATENT DOCUMENTS

| 5,956,231 A | 9/1999 | Yamada et al. |
| 11,315,850 B2 * | 4/2022 | Sasaki ............... H01L 23/49548 |

(Continued)

FOREIGN PATENT DOCUMENTS

| JP | S606253 U | 1/1985 |
| JP | H8191130 A | 7/1996 |

(Continued)

OTHER PUBLICATIONS

International Search Report in PCT/JP2019/012629, mailed Jun. 4, 2019. 4pp.

*Primary Examiner* — Alonzo Chambliss
(74) *Attorney, Agent, or Firm* — HAUPTMAN HAM, LLP

(57) ABSTRACT

A semiconductor apparatus according to the present invention is a semiconductor apparatus on which a plurality of external terminals are disposed. The semiconductor apparatus includes: a first lead portions having die pads, first outer leads and first inner leads; chips; second lead portions having second outer leads and second inner lead; and a resin. On at least one of the first inner leads, the second inner leads and the die pads, a terminal temperature equalizing structure which restricts a heat transfer amount of heat transferred from the chips to predetermined external terminals, and equalizes respective terminal temperatures of a plurality of external terminals is formed.

According to the semiconductor apparatus of the present invention, it is possible to prevent specific external terminals (Continued)

from becoming extremely high temperature when the semiconductor apparatus is mounted.

14 Claims, 15 Drawing Sheets

(52) U.S. Cl.
CPC .. *H01L 23/49541* (2013.01); *H01L 23/49551* (2013.01); *H01L 24/38* (2013.01); *H01L 24/40* (2013.01); *H01L 24/41* (2013.01); *H01L 24/84* (2013.01); *H01L 2924/181* (2013.01)

(58) Field of Classification Search
CPC ... H01L 24/41; H01L 2924/181; H01L 24/37; H01L 24/38; H01L 24/40; H01L 24/84; H01L 2224/40177; H01L 29/7412
See application file for complete search history.

(56) References Cited

U.S. PATENT DOCUMENTS

| | | | |
|---|---|---|---|
| 11,676,931 B2* | 6/2023 | Choi | H01L 23/3142 |
| | | | 257/676 |
| 2014/0084436 A1* | 3/2014 | Funatsu | H01L 24/38 |
| | | | 257/676 |

FOREIGN PATENT DOCUMENTS

| JP | 2006210586 A | 8/2006 |
|---|---|---|
| JP | 20134848 A | 1/2013 |
| TW | 201214586 A1 | 4/2012 |

* cited by examiner

FIG.1A
FIG.1B
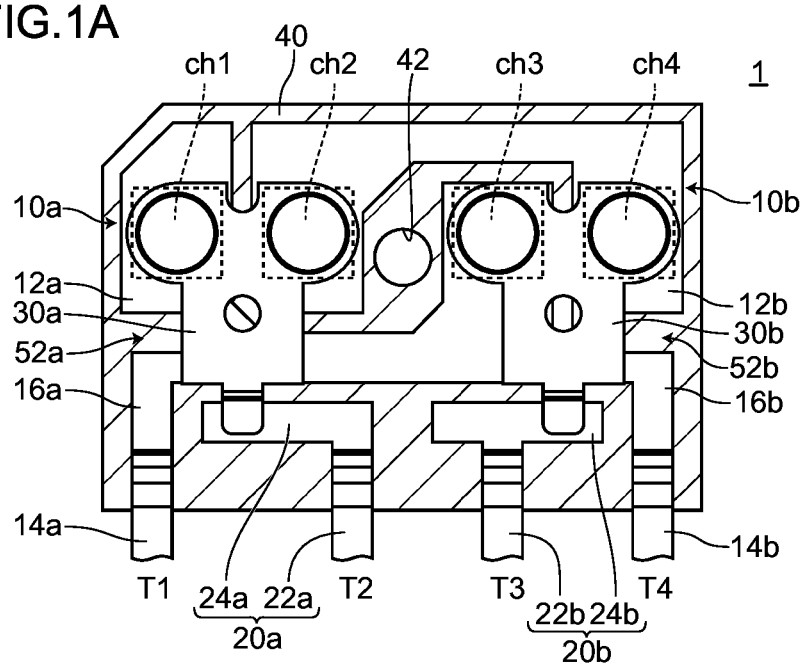
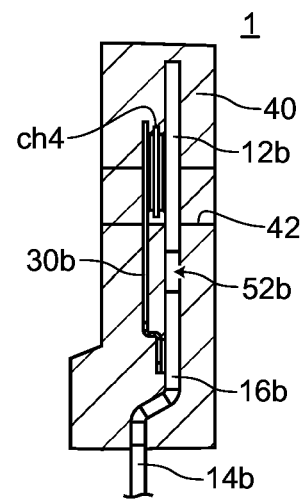
FIG.1C
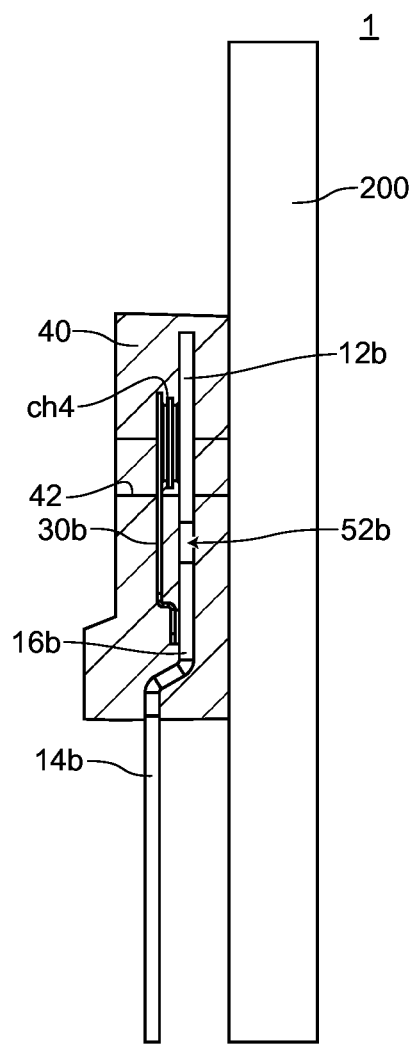

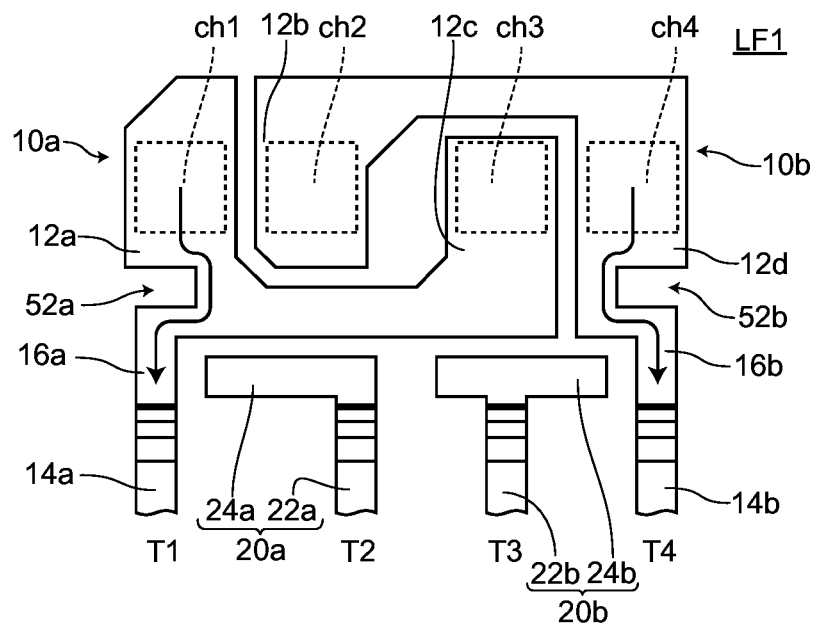 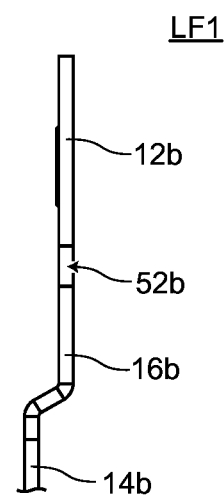
FIG.2A  FIG.2B
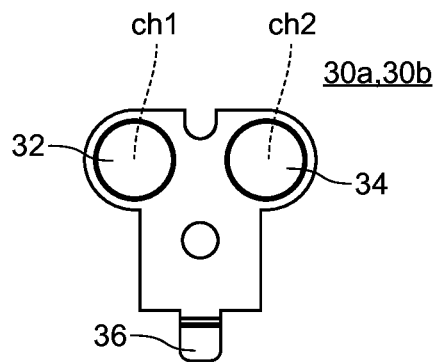 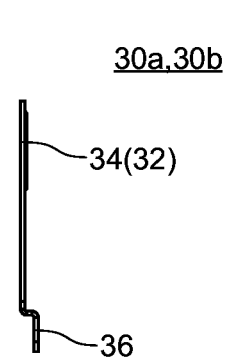
FIG.3A  FIG.3B

SEMICONDUCTOR APPARATUS MOUNTED ELECTRICALLY CONNECTED TO A PLURALITY OF EXTERNAL TERMINALS BY A LEAD

RELATED APPLICATIONS

The present application is a National Phase of International Application Number PCT/JP2019/012629, filed Mar. 25, 2019.

TECHNICAL FIELD

The present invention relates to a semiconductor apparatus, a lead frame and a power source apparatus.

BACKGROUND ART

Conventionally, there has been known a semiconductor apparatus which includes a plurality of external terminals (see patent literature 1, for example).

FIG. 22 is a plan view showing a conventional semiconductor apparatus 900.

As shown in FIG. 22, the conventional semiconductor apparatus 900 is a bridge diode which includes a plurality of external terminals T1 to T4. The semiconductor apparatus 900 also includes: two first lead portions 910a, 910b; chips ch1 to ch4 having surface electrodes formed on a surface thereof on a side opposite to a surface thereof which faces die pads; two second lead portions 920a, 920b; and a resin 940.

The first lead portion 910a includes: die pads 912a, 912c; a first outer lead 914a which forms an external terminal T1; and a first inner lead 916a which connects the die pads 912a, 912c and the first outer lead 914a to each other. The first lead portion 910b includes: die pads 912b, 912d; a first outer lead 914b which forms an external terminal T4; and a first inner lead 916b which connects the die pads 912b, 912d and the first outer lead 914b to each other.

The second lead portion 920a includes: a second outer lead 922a which forms an external terminal T2; and a second inner lead 924a which is connected to surface electrodes of the chips ch1, ch2 via a clip lead 930a. The second lead portion 920b includes: a second outer lead 922b which forms an external terminal T3; and a second inner lead 924b which is connected to surface electrodes of the chips ch3, ch4 via a clip lead 930b.

The resin 940 seals the die pads 912a, 912b, 912c, 912d, the first inner leads 916a, 916b, the chips ch1 to ch4 and the second inner leads 924a, 924b.

CITATION LIST

Patent Literature

Patent literature 1: JP S60-6253 Y

SUMMARY OF INVENTION

Technical Problem

Recently, along with a tendency of recent years where electronic equipment which uses a large current has been popularly used, there has been a demand for a semiconductor apparatus which uses a semiconductor device (chip) having a large rated current. In such a semiconductor apparatus which uses the semiconductor device having a large rated current, a configuration is considered where a large current can be supplied to the semiconductor device by increasing a cross-sectional area of a lead frame (a first lead portion and a second lead portion) (hereinafter, referred to as the semiconductor apparatus according to Background Art, see FIG. 6A and FIG. 6B).

In the use of the semiconductor apparatus according to Background Art, the cross-sectional area of the lead frame is large and hence, heat generated in the chip can be easily transferred to external terminals whereby a junction temperature of the chip can be easily lowered.

However, in the semiconductor apparatus according to Background Art, heat transfer amounts of heat from the chip to the respective external terminals are liable to become non-uniform and hence, specific external terminals are liable to become a high temperature (see external terminals T1, T4 indicated by a broken line in FIG. 7). Accordingly, there is a concern that a defect occurs at a connecting portion between the external terminal and a substrate.

The present invention has been made to overcome the above-mentioned drawback, and it is an object of the present invention to provide a semiconductor apparatus, a lead frame and a power source apparatus which can prevent a specific external terminal from becoming an extremely high temperature when the semiconductor apparatus is mounted.

Solution to Problem

[1] The semiconductor apparatus according to the present invention is a semiconductor apparatus provided with a plurality of external terminals, the semiconductor apparatus which includes: a first lead portion including: a die pad, a first outer lead forming one of the plurality of external terminals, and a first inner lead connecting the die pad and the first outer lead to each other; a chip mounted on the die pad, a surface electrode being formed on a surface of the chip on a side opposite to a die pad side;

a second lead portion including: a second outer lead forming another external terminal of the plurality of external terminals, and a second inner lead being connected to the surface electrode via a clip lead; and a resin sealing the die pad, the first inner lead, the chip and the second inner lead, a heat radiation fin being mountable on the semiconductor apparatus at a position disposed adjacently to the resin, wherein a terminal temperature equalizing structure which restricts a heat transfer amount of heat from the chip to a predetermined external terminal of the plurality of external terminals and equalizes respective terminal temperatures of the plurality of external terminals is formed on at least one of the first inner lead and the second inner lead.

[2] In the semiconductor apparatus according to the present invention, it is preferable that the terminal temperature equalizing structure have a cutout or a hole formed in at least one of the first inner lead and the second inner lead.

[3] In the semiconductor apparatus according to the present invention, it is preferable that the cutout or the hole be disposed at a position where a current path through which a current flows in the first inner lead or the second inner lead is formed into a roundabout path.

[4] In the semiconductor apparatus according to the present invention, it is preferable that the cutout or the hole be disposed at a position where the current path through which the current flows in the first inner lead or the second inner lead is formed into a crank shape.

[5] In the semiconductor apparatus according to the present invention, it is preferable that a thickness of the clip lead be smaller than both a thickness of the first lead portion and a thickness of the second lead portion.

[6] In the semiconductor apparatus according to the present invention, it is preferable that assuming a heat resistance between one of the plurality of external terminals and one chip which forms the chip connected to the external terminal as a chip external-terminal heat resistance θ when one of the plurality of external terminals is connected to the one chip, and assuming a sum of heat resistances between one of the plurality of external terminals and two or more chips form the chip connected to the one of the plurality of external terminals as the chip external-terminal heat resistance θ when one of the plurality of external terminals is connected to the two or more chips, the chip external-terminal heat resistance θ be equal among the respective external terminals.

[7] In the semiconductor apparatus according to the present invention, it is preferable that as viewed in a cross section, the die pad include a depressed portion formed so as to position the die pad closer to the heat radiation fin than the first inner lead on a side where the heat radiation fin is mounted.

[8] In the semiconductor apparatus according to the present invention, it is preferable that the semiconductor apparatus be a bridge diode.

[9] In the semiconductor apparatus according to the present invention, it is preferable that the plurality of external terminals be four external terminals arranged parallel to each other, four chips be provided as the chip, two first lead portions each having two die pads are provided as the first lead portion, two first lead portions each have a portion formed in a U shape by the first inner lead and the die pad, and the portions which are formed in a U shape be combined with each other in a staggered manner, and the respective die pads be disposed in a row along a predetermined direction, and the cutout or the hole be formed in both the first inner leads of the two first lead portions.

[10] In the semiconductor apparatus according to the present invention, it is preferable that the plurality of external terminals be three external terminals arranged parallel to each other, two chips be provided as the chip, two first lead portions each having one die pad be provided as the first lead portion, one second lead portion be provided as the second lead portion, and the cutout or the hole be formed in all of the first inner leads of the two first lead portions and the second inner lead of the second lead portion.

[11] In the semiconductor apparatus according to the present invention, it is preferable that the plurality of external terminals be five external terminals, six chips be provided as the chip, three first lead portions each having two die pads be provided as the first lead portion, two second lead portions be provided as the second lead portion, the respective second inner leads be connected to any one of two chips mounted on the respective first lead portions via the clip lead, and the cutout or the hole be formed in all of the first inner leads of the three first lead portions, and the second inner leads of the two second lead portions.

[12] A lead frame according to the present invention includes the first lead portion and the second lead portion used in the semiconductor apparatus according to any one of claims 1 to 11.

[13] A power source apparatus according to the present invention includes the semiconductor apparatus according to any one of claims 1 to 11.

Advantageous Effects of Invention

According to the semiconductor apparatus, the lead frame and the power source apparatus of the present invention, on at least one of the first inner lead and the second inner lead, the terminal temperature equalizing structure which restricts a heat transfer amount of heat transferred from the chip to the predetermined external terminal, and equalizes respective terminal temperatures of the plurality of external terminals is formed. Accordingly, it is possible to prevent the occurrence of irregularities or non-uniformity in heat transfer amounts of heat from the chips to the respective external terminals and hence, it is possible to prevent the specific external terminal from becoming a high temperature. As a result, when the semiconductor apparatus is mounted on the substrate, it is possible to prevent the occurrence of a defect at a connecting portion between the specific external terminal and the substrate.

BRIEF DESCRIPTION OF DRAWINGS

FIG. 1A to FIG. 1C are views showing a semiconductor apparatus 1 according to an embodiment 1.

FIG. 2A and FIG. 2B are views for describing a lead frame LF1 according to the embodiment 1.

FIG. 3A and FIG. 3B are views for describing clip leads 30a, 30b according to the embodiment 1.

DESCRIPTION OF EMBODIMENTS

Hereinafter, a semiconductor apparatus, a clip lead and a power source apparatus according to the present invention are described in conjunction with embodiments shown in drawings. The respective views are schematic views, and do not always strictly reflect actual sizes.

Embodiment 1

1. Configurations of Semiconductor Apparatus 1 and Lead Frame LF1 of Embodiment 1

Figure 4A:
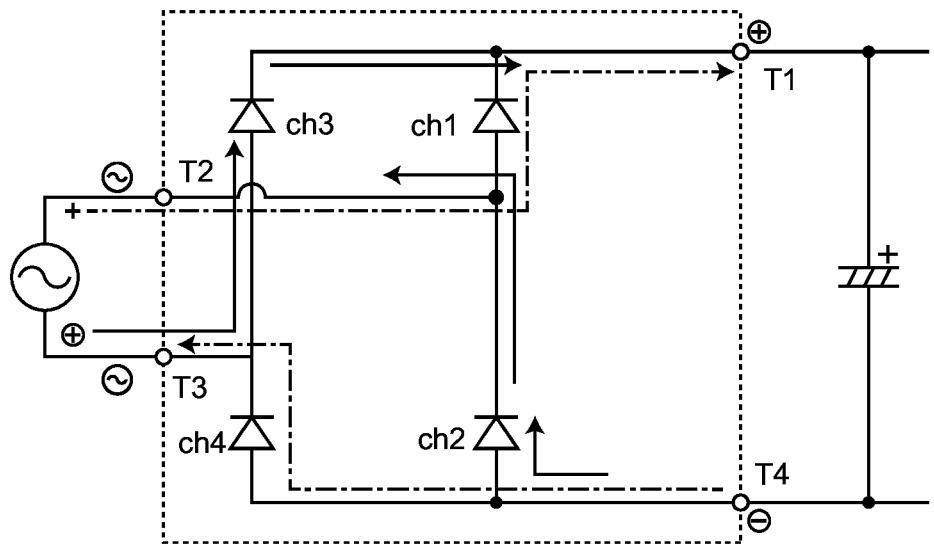
FIG. 4A and FIG. 4B are circuits diagram showing a power conversion circuit (power source apparatus) which uses the semiconductor apparatus 1 according to the embodiment 1.
Figure 4B:
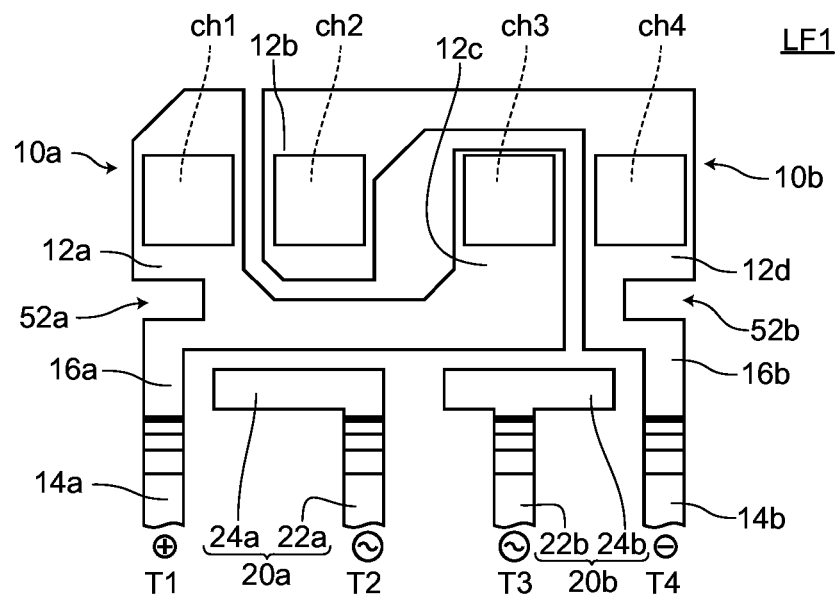
Figure 5A:
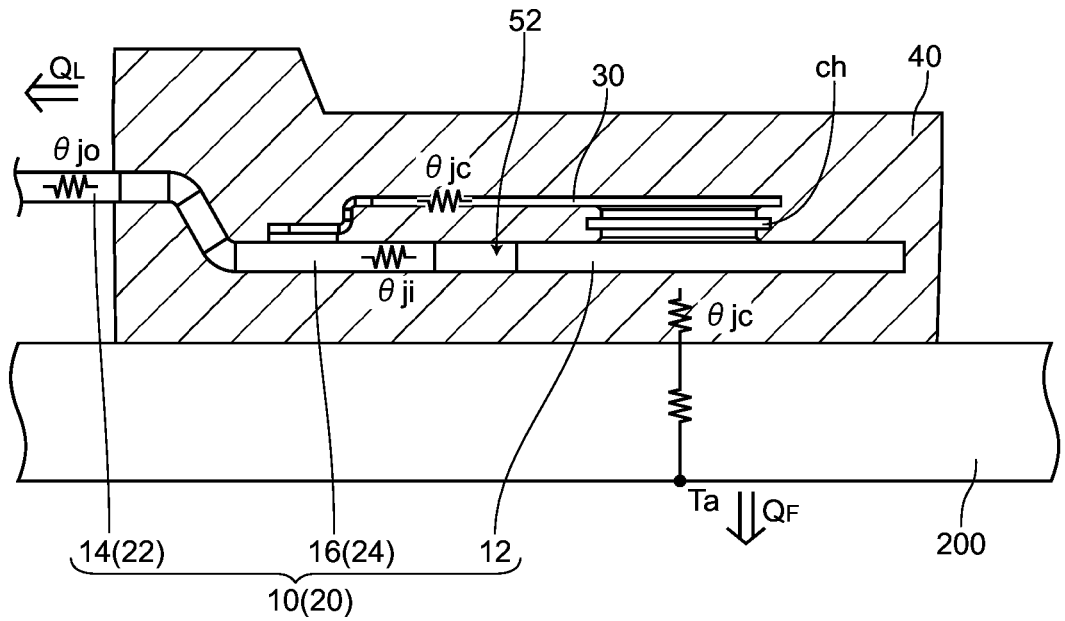
FIG. 5A and FIG. 5B are views for describing a heat resistance in the semiconductor apparatus 1 according to the embodiment 1.
Figure 5B:
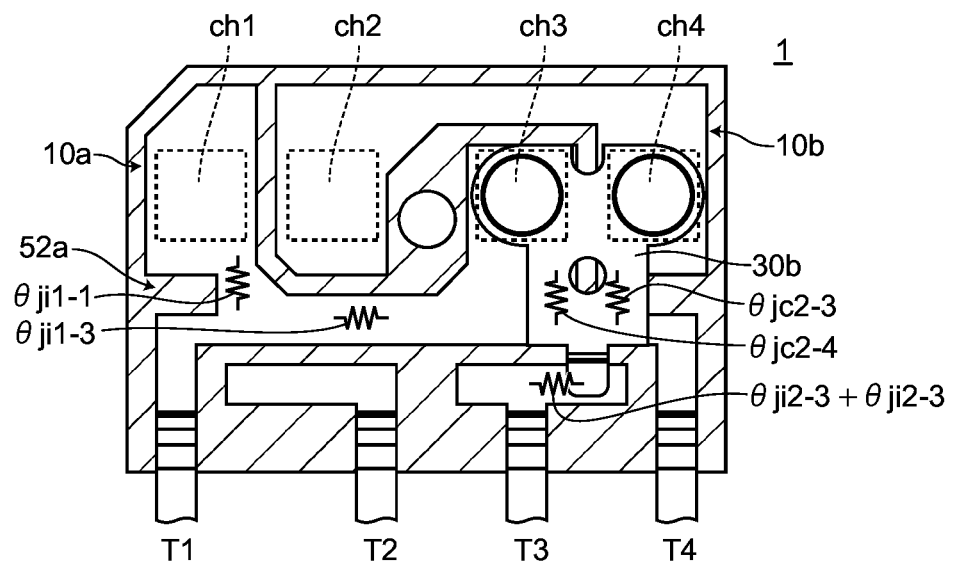

FIG. 1A to FIG. 1C are views showing a semiconductor apparatus 1 according to an embodiment 1. FIG. 1A is a plan view of the semiconductor apparatus 1, FIG. 1B is a cross-sectional side view of FIG. 1A, and FIG. 1C is a view showing a state where a heat radiation fin 200 is mounted on the semiconductor apparatus 1. FIG. 2A and FIG. 2B are views for describing a lead frame LF1 according to the embodiment 1. FIG. 2A is a plan view of the lead frame LF1, and FIG. 2B is a side view of the lead frame LF1. FIG. 3A and FIG. 3B are views for describing a clip lead 30 according to the embodiment 1. FIG. 3A is a front view of the clip lead 30, and FIG. 3B is a side view of the clip lead 30. FIG. 4A and FIG. 4B are views showing a power source apparatus (power conversion circuit) which uses the semiconductor apparatus 1 according to the embodiment 1. FIG. 4A is a view showing an equivalent circuit of a power source apparatus (power conversion circuit) which uses the semiconductor apparatus 1, and FIG. 4B is a view showing the lead frame LF1 of the semiconductor apparatus 1. FIG. 5A and FIG. 5B are views for describing a heat resistance in the semiconductor apparatus 1 according to the embodiment 1. FIG. 5A is a cross-sectional view for describing a heat resistance of the semiconductor apparatus 1, and FIG. 5B is a view for describing a heat resistance from a chip to external terminals T1, T3.

As shown in FIG. 1A to FIG. 1C and FIG. 2A to FIG. 2B, the semiconductor apparatus 1 according to the embodiment 1 is a bridge diode in which four external terminals T1 to T4 are arranged parallel to each other at predetermined intervals. The semiconductor apparatus 1 according to the embodiment 1 includes: first lead portions 10a, 10b; four chips ch1, ch2, ch3 and ch4; second lead portions 20a, 20b; clip leads 30a, 30b; a resin 40; and cutouts 52a, 52b which function as terminal temperature equalizing structures. The lead frame LF1 is formed of: the first lead portions 10a, 10b; and the second lead portions 20a, 20b (see FIG. 2A and FIG. 2B).

The semiconductor apparatus 1 according to the embodiment 1 is applicable to a power source apparatus (power conversion circuit) according to the embodiment 1 shown in FIG. 4A. As shown in FIG. 4A and FIG. 4B, in the semiconductor apparatus 1 according to the embodiment 1, external terminals T2, T3 are connected to an alternating current power source, an external terminal T1 forms a + terminal, and an external terminal T4 forms a − terminal. When the external terminal T2 becomes the alternating current + terminal, a current flows from a load through a path formed of the external terminal T4, the chip ch4, the external terminal T3, the alternating current power source, the external terminal T2, the chip ch1, and the external terminal T1 (see an arrow indicated by a chain line in FIG. 4A and FIG. 4B). When the external terminal T2 becomes the alternating current−terminal, a current flows from the load through a path formed of the external terminal T4, the chip ch2, the external terminal T2, the alternating current power source, the external terminal T3, the chip ch3, the external terminal T1 (see an arrow indicated by a solid line in FIG. 4A and FIG. 4B).

Accordingly, there is no possibility that the chips ch1, ch3 mounted on the first lead portion 10a are simultaneously turned on, and there is no possibility that the chips ch2, ch4 mounted on the first lead portion 10b are simultaneously turned on. That is, there is no possibility that a plurality of chips mounted on one first lead portion are simultaneously turned on.

As shown in FIG. 1A to FIG. 1C, a mounting hole 42 is formed in a center portion of the semiconductor apparatus 1. The mounting hole 42 is provided for mounting the heat radiation fin 200 on the semiconductor apparatus 1. The mounting hole 42 penetrates semiconductor apparatus 1 from a front surface side (a front side of a sheet of paper on which FIG. 1A is drawn) to a back surface side (a deep side of the sheet of paper on which FIG. 1A is drawn) between the chip ch2 and the chip ch3 (see FIG. 1C). With such a configuration, the heat radiation fin 200 can be mounted on the semiconductor apparatus 1 by making use of the mounting hole 42.

As shown in FIG. 2A and FIG. 2B, the first lead portion 10a includes die pads 12a and 12c, a first outer lead 14a which forms the external terminal T1, and a first inner lead 16a which connects the die pads 12a, 12c and the first outer lead 14a to each other. The first outer lead 14a and the die pad 12a are disposed on an approximately same straight line, and the die pad 12a and the die pad 12c are disposed in a spaced apart manner with a predetermined distance in a direction perpendicular to the straight line on which the first outer lead 14a and the die pad 12a are disposed.

The first inner lead 16a connects the first outer lead 14a and the die pad 12a to each other in a straight line manner, and an intermediate portion of the first inner lead 16a is branched, and a branched portion is bent in a hook shape and is connected to the die pad 12c. In the first inner lead 16a, the die pad 12a, the first inner lead 16a and the die pad 12c form a portion having a U shape.

In the first inner lead 16a, the cutout 52a which functions as a terminal temperature equalizing structure is formed between the die pad 12a and the first outer lead 14a. A current which flows from the chip ch1 flows through the first inner lead 16a connected to a right lower side of the chip ch1 and flows downward, is bent in a crank shape in an intermediate portion of the first inner lead 16a, and flows toward the first outer lead 14a on a lower side (see an arrow shown in FIG. 2A and FIG. 2B).

That is, the cutout 52b is disposed at a position where a current path through which a current flows in the first inner lead 16a is formed into a roundabout path, that is, the position where the current path through which a current flows in the first inner lead 16a is bent in a crank shape. The detail of the terminal temperature equalizing structure is described later.

As shown in FIG. 2A and FIG. 2B, the first lead portion 10b includes die pads 12b and 12d, a first outer lead 14b which forms the external terminal T4, and a first inner lead 16b which connects the die pads 12b, 12d and the first outer lead 14b to each other. The first outer lead 14b and the die pad 12d are disposed on an approximately same straight line, and the die pad 12b and the die pad 12d are disposed in a spaced apart manner with a predetermined distance in a direction perpendicular to the straight line on which the first outer lead 14b and the die pad 12d are disposed.

The first inner lead 16b connects the first outer lead 14b and the die pad 12d to each other in a straight line manner, and the die pad 12d is connected to the die pad 12b. That is, the first lead portion 10b is formed in a hook shape. In the first inner lead 16a, the die pad 12b, the first inner lead 16b and the die pad 12d form a portion having a U shape.

In the first inner lead 16b, a cutout 52b which functions as a terminal temperature equalizing structure is formed between the die pad 12d and the first outer lead 14b. A current which flows from the chip ch4 flows through the first inner lead 16b connected to a left lower side of the chip ch4 and flows downward, is bent in a crank shape in an intermediate portion of the first inner lead 16b, and flows toward the first outer lead 14b on a lower side (see an arrow shown in FIG. 2A and FIG. 2B).

That is, the cutout 52b is disposed at a position where a current path through which a current flows in the first inner lead 16b is formed into a roundabout path, that is, the position where the current path through which a current flows in the first inner lead 16b is bent in a crank shape.

The chips ch3 to ch4 are respectively mounted on the die pads 12a to 12d. Each of the chips ch3 to ch4 is a diode which has surface electrodes (an anode electrode and a cathode electrode) on a die pad side and a side opposite to the die pad side respectively. The respective chips are disposed at predetermined intervals so as to prevent specific portions or specific external terminals from becoming a high temperature.

As shown in FIG. 1A to FIG. 1C, the second lead portion 20a includes a second outer lead 22a which forms the external terminal T2, and a second inner lead 24a which is connected to the surface electrodes of the chips ch1 and ch2 via the clip lead 30a.

The second lead portion 20b includes a second outer lead 22b which forms the external terminal T3, and a second inner lead 24b which is connected to the surface electrodes of the chips ch3 and ch4 via the clip lead 30b.

The clip leads 30a and 30b are formed by bending a flat plate made of metal. As shown in FIG. 3A and FIG. 3B, each of the clip lead 30a, 30b includes chip bonding surfaces 32, 34 to which the chips are bonded, and an inner lead connecting portion 36 which is connected to the inner lead. A thickness of the clip lead 30a, 30b is smaller than a thickness of the first lead portion 10a, 10b and a thickness of the second lead portion 20a, 20b.

The resin 40 seals the die pads 12a to 12d, the first inner leads 16a, 16b, the chips ch3 to ch4, the second inner leads 24a, 24b, and the clip leads 30a and 30b. A suitable resin can be used as a resin 40.

The terminal temperature equalizing structure is described in detail.

The terminal temperature equalizing structure includes the cutout 52a, 52b formed in the first inner lead 16a, 16b. The terminal temperature equalizing structure which restricts an amount of heat transferred from the chips to predetermined external terminals (the external terminals T1, T4) thus equalizing temperatures of respective terminals of the external terminals T1 to T4.

As shown in FIG. 5A, heat from the respective chips is discharged to the outside through roughly three routes. The first route is a route by which heat is transferred to the heat radiation fin 200 through the die pad 12 and the resin 40 (the resin and a screw for mounting the heat radiation fin). The second route is a route by which heat is transferred to the first outer lead 14 through the die pad 12 and the first inner lead 16. The third route is a route by which heat is transferred to the second outer lead 22 from the surface electrode through the clip lead 30.

In such heat transfer, a large amount of heat from the chip ch is transferred to the heat radiation fin 200, and heat QF is discharged from the heat radiation fin 200 to the outside. However, when a semiconductor device (chip) having a large rated current is used, a large current flows through the semiconductor device and hence, it is necessary to increase a cross-sectional area of the first lead portion 10 and a cross-sectional area of the second lead portion 20 whereby heat is easily transferred to the external terminals (outer leads). Particularly, the first outer lead 14 of the first lead portion 10 on which the chips ch are mounted receives a large heat transfer amount of heat and hence, the first outer lead 14 is liable to become a high temperature. In view of such circumstances, the terminal temperature equalizing structure restricts the transfer of heat QL from the chips ch to the external terminals by increasing a heat resistance $\theta ji$ of the first inner lead 16 leading toward the first outer lead 14, a heat resistance $\theta ji$ of the second inner lead 24 leading toward the second outer lead 22, and a heat resistance $\theta jc$ of the clip lead 30. With such restriction of the transfer of the heat QL, a restricted amount of heat is transferred to the heat radiation fin and hence, discharging of heat to the outside is promoted.

Next, terminal temperatures of the respective external terminals are described.

In the embodiment 1, two chips are mounted on the first lead portions 10a, 10b respectively and hence, the first outer leads 14a, 14b (external terminals T1, T4) are liable to become a high temperature. In the terminal temperature equalizing structure, the cutouts 52a, 52b are formed in the first inner leads 16a, 16b and hence, the heat resistance $\theta ji$ is increased whereby a heat transfer amount of heat transferred to the external terminals T1 and T4 is restricted. Accordingly, a heat transfer amount of heat transferred to the first outer leads 14a, 14b (external terminals T1, T4) is decreased and hence, the heat transfer amount of heat transferred to the first outer leads 14a, 14b is balanced with a heat transfer amount of heat transferred to other external terminals T2, T3 (second outer leads 22a, 22b). As a result, the respective terminal temperatures of the respective external terminals T1 to T4 can be made equal.

In the above-mentioned configuration, in a case where the external terminal is connected to two or more chips, assuming a sum of heat resistances between the external terminal and the respective chips connected to the external terminal as "chip external-terminal heat resistance $\theta$", the respective external terminals have the equal "chip external-terminal heat resistance $\theta$". In this embodiment, "chip external-terminal heat resistance $\theta$" of the respective external terminals becomes as follows.

As shown in FIG. 5B, the external terminal T1 is connected to the chip ch1 and the chip ch3 via the first inner lead 16a. Accordingly, "chip external-terminal heat resistance $\theta$" at the external terminal T1 becomes a sum of a heat resistance $\theta ji1\text{-}1$ of the first inner lead 16a from the chip ch1 to the first outer lead 14a, and a heat resistance $\theta ji1\text{-}3$ of the first inner lead 16a from the chip ch3 to the first outer lead 14a.

The external terminal T2 is connected to the chip ch1 and the chip ch2 via the clip lead 30a and the second inner lead 24a. Accordingly, "chip external-terminal heat resistance $\theta$" at the external terminal T2 becomes a sum of a heat resistance which resists a heat flow from the chip ch1 to the external terminal T2 and a heat resistance which resists a heat flow from the chip ch2 to the external terminal T2.

The heat resistance which resists a heat flow from the chip ch1 to the external terminal T2 is a sum of a heat resistance θji2-1 of the clip lead 30a and a heat resistance θjc1-2 of the second inner lead. The heat resistance which resists a heat flow from the chip ch2 to the external terminal T2 is a sum of heat resistance θjc1-2 of the clip lead 30a and a heat resistance θji2-2 of the second inner lead.

As shown in FIG. 5B, the external terminal T3 is connected to the chip ch3 and the chip ch4 via the clip lead 30b and the second inner lead 24b. Accordingly, "chip external-terminal heat resistance θ" at the external terminal T3 becomes a sum of a heat resistance which resists a heat flow from the chip ch3 to the external terminal T3, and a heat resistance which resists a heat flow from the chip ch4 to the external terminal T3.

The heat resistance which resists a heat flow from the chip ch3 to the external terminal T3 is a sum of a heat resistance θjc2-3 of the clip lead 30b and a heat resistance θji2-3 of the second inner lead. A heat resistance which resists a heat flow from the chip ch4 to the external terminal T3 is a sum of a heat resistance θjc2-4 of the clip lead 30a and a heat resistance θji2-4 of the second inner lead.

The external terminal T4 is connected to the chip ch2 and the chip ch4 via the first inner lead 16b. Accordingly, "chip external-terminal heat resistance θ" at the external terminal T4 becomes a sum of a heat resistance θji1-2 of the first inner lead 16b from the chip ch2 to the first outer lead 14b, and a heat resistance θji1-4 of the first inner lead 16b from the chip ch4 to the first outer lead 14b.

2. Text Examples

Test Example 1

Figures 6A, 6B:
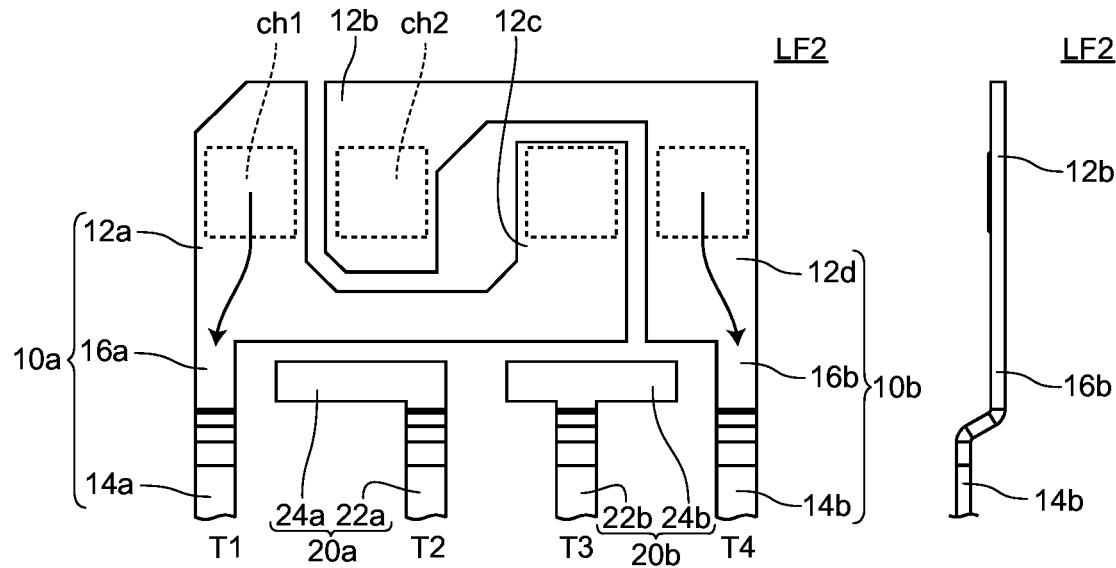
FIG. 6A and FIG. 6B are views showing a lead frame LF2 of a semiconductor apparatus 900 according to Background Art.
Figure 7:
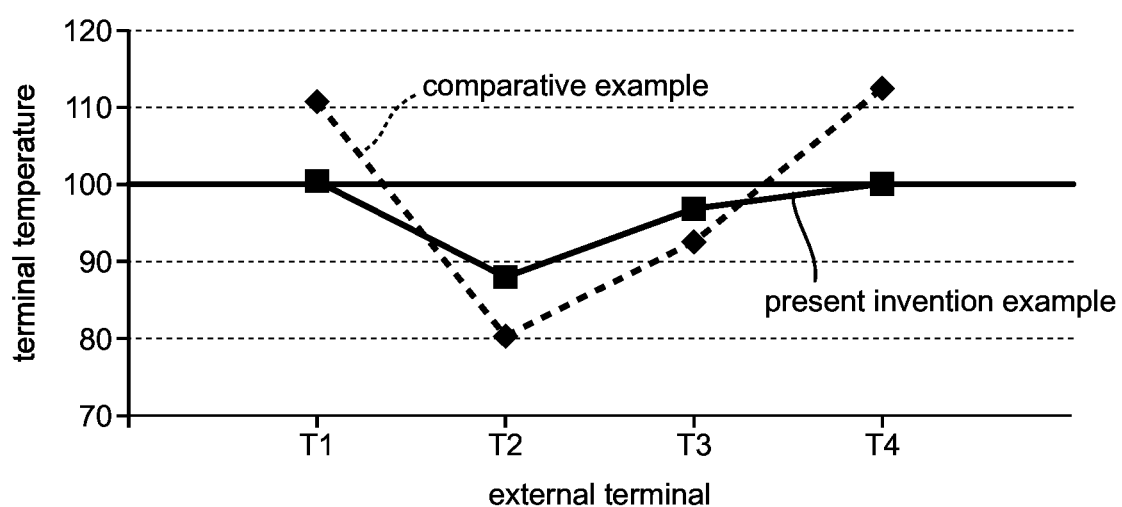
FIG. 7 is a graph showing a terminal temperature in a semiconductor apparatuses according to a comparative example and a present invention example.

FIG. 6A and FIG. 6B are views showing a lead frame LF2 of a semiconductor apparatus according to Background Art. FIG. 6A is a front view of the lead frame LF2, and FIG. 6B is a side view of the lead frame LF2. FIG. 7 is a graph showing a terminal temperature of the semiconductor apparatus according to a comparative example and a terminal temperature of the semiconductor apparatus according to a present invention example.

A test example 1 is a test example for demonstrating that "the semiconductor apparatus according to the present invention can prevent a specific external terminal from becoming an extremely high temperature when the semiconductor apparatus is mounted".

(1) Comparative Example and Present Invention Example

The semiconductor apparatus according to the comparative example is a semiconductor apparatus which has substantially the same configuration as the semiconductor apparatus 1 according to the embodiment 1 except for a point that cutouts are not formed in a first inner lead as a terminal temperature equalizing structure (see FIG. 6A and FIG. 6B).

The semiconductor apparatus according to the present invention example is a semiconductor apparatus having substantially the same configuration as the semiconductor apparatus 1 according to the embodiment 1.

(2) Simulation Method

A thermal analysis is applied to each of the semiconductor apparatus of the comparative example and the semiconductor apparatus of the present invention example in simulation, and terminal temperatures of the respective external terminals are obtained.

(3) Evaluation Result

As shown in FIG. 7, in the semiconductor apparatus according to the comparative example, with respect to the external terminals T2, T3 (second outer leads), a terminal temperature is below a reference temperature (100° C.). On the other hand, with respect to the external terminals T1, T4 (first outer leads), the terminal temperature is above the reference temperature (100° C.) (see a broken line in FIG. 7).

On the other hand, in the semiconductor apparatus according to the present invention example, the terminal temperature is below the reference temperature with respect to all external terminals T1, T2, T3 and T4 (see a solid line in FIG. 7).

From the above, it is understood that, in the semiconductor apparatus according to the comparative example, the terminal temperatures of the specific external terminals T1, T4 become an extremely high temperature and hence, it is difficult to "prevent the specific external terminals from becoming an extremely high temperature when the semiconductor apparatus is mounted". On the other hand, it is also understood that, in the semiconductor apparatus according to the present invention example, the terminal temperature becomes equal to or less than the reference temperature with respect to all external terminals T1 to T4 and hence, it is possible to "prevent the specific external terminals from becoming an extremely high temperature when the semiconductor apparatus is mounted".

Test Example 2

Figure 8:
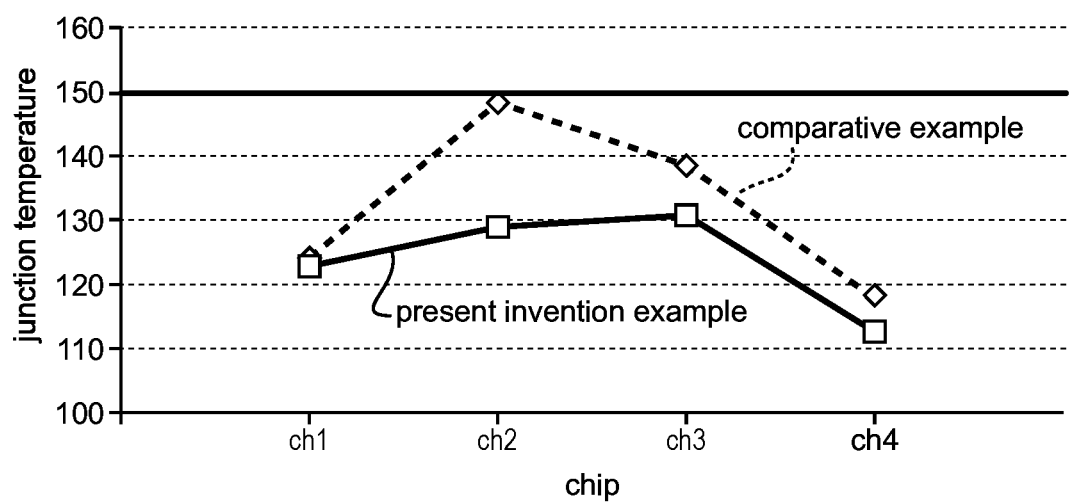
FIG. 8 is a graph showing junction temperatures in the semiconductor apparatuses according to the comparative example and the present invention example.

FIG. 8 is a graph showing junction temperatures in the semiconductor apparatuses according to the comparative example and the present invention example.

The test example is a test example demonstrating that "in the semiconductor apparatus according to the present invention, the junction temperatures of the respective chips become equal to or less than a reference temperature and hence, heat from the respective chips can be efficiently discharged".

(1) Comparative Example and Present Invention Example

The semiconductor apparatus according to the comparative example and the semiconductor apparatus according to the present invention example are semiconductor apparatuses which are substantially equal to the semiconductor apparatus according to the comparative example and the semiconductor apparatus according to the present invention example used in the test example 1.

(2) Simulation Method

A thermal analysis is applied to each of the semiconductor apparatus and the semiconductor apparatus of the comparative example and the present invention example respectively in simulation, and junction temperatures of the respective chips are obtained.

(3) Evaluation Result

As shown in FIG. 8, in the semiconductor apparatus according to the comparative example, the junction temperature is below a reference temperature with respect to all chips (see a broken line in FIG. 8). Also in the semiconductor apparatus according to the present invention example, the junction temperature is below the reference temperature with respect to all chips and, further, the junction temperature is below the junction temperature in the semiconductor apparatus according to the comparative example with respect to all chips (see a solid line in FIG. 8).

From the above, it is understood that, in the semiconductor apparatus according to the present invention example, the junction temperature is below the reference temperature with respect to all chips and, further, the junction temperature is below the junction temperature in the semiconductor apparatus according to the comparative example and hence, "the semiconductor apparatus according to the present invention can efficiently discharge heat from the respective chips, and can set the junction temperatures of the respective chips equal to or less than the reference temperature".

3. Advantageous Effects Acquired by Semiconductor Apparatus 1, Lead Frame LF1 and Power Source Apparatus According to Embodiment 1

According to the semiconductor apparatus 1, the lead frame LF1 and the power source apparatus of the embodiment 1, the terminal temperature equalizing structure which equalizes heat transfer amounts of heat from the chips ch1 to ch4 to the respective external terminals T1 to T4 is formed on each of the first inner leads 16a, 16b. Accordingly, it is possible to prevent the occurrence of irregularities or non-uniformity in heat transfer amounts of heat from the chips ch1 to ch4 to the respective external terminals T1 to T4 and hence, it is possible to prevent the specific external terminals (particularly T1 and T4) from becoming a high temperature. As a result, when the semiconductor apparatus 1 is mounted on the substrate, it is possible to prevent the occurrence of a defect at a connecting portion between the specific external terminal and the substrate.

According to the semiconductor apparatus 1 of the embodiment 1, the terminal temperature equalizing structure which equalizes heat transfer amounts of heat from the chips ch1 to ch4 to the respective external terminals T1 to T4 is formed on each of the first inner leads 16a, 16b. Accordingly, when the heat radiation fin 200 is mounted on the semiconductor apparatus 1, a heat transfer amount of heat from the respective chips and transferred to the first outer leads 14a, 14b can be decreased and, further, a heat transfer amount of heat transferred to the heat radiation fin 200 mounted at a position disposed adjacently to the resin 40 via the resin 40 can be increased. As a result, heat from the chips can be efficiently discharged to the outside and hence, junction temperatures of the respective chips can be set to a temperature equal to or less than the reference temperature.

In the semiconductor apparatus 1 according to the embodiment 1, the terminal temperature equalizing structure has the cutouts 52a, 52b in the first inner leads 16a, 16b and hence, a heat resistance from the chip ch1 to the first outer lead 14a and a heat resistance from the chips ch3, ch4 to the first outer lead 14b can be increased. Accordingly, a heat transfer amount of heat generated from the respective chips and transferred to the first outer leads 14a, 14b can be decreased and, further, a heat transfer amount of heat transferred to the heat radiation fin 200 mounted at the position disposed adjacently to the resin 40 via the resin 40 can be increased. As a result, heat from the chips can be efficiently discharged to the outside and hence, junction temperatures of the respective chips can be lowered (see FIG. 8).

In the semiconductor apparatus 1 according to the embodiment 1, the terminal temperature equalizing structure has the cutouts 52a, 52b at the first inner leads 16a, 16b. Accordingly, it is possible to increase a heat resistance to the first outer leads 14a, 14b of the first lead portion which is liable to become a high temperature due to the plurality of chips mounted on the first lead portions. Accordingly, heat transfer amounts of heat transferred to the respective external terminals can be transferred equally and hence, terminal temperatures of the respective external terminals can be made equal or uniform.

In the semiconductor apparatus 1 according to the embodiment 1, the cutouts 52a, 52b are formed at the positions where the current paths through which a current flows in the first inner leads 16a, 16b is formed into roundabout paths. Accordingly, the heat resistance of the first inner leads 16a, 16b can be increased with a relatively simple configuration. Accordingly, a heat transfer amount of heat from the respective chips and transferred to the first outer leads 14a, 14b can be decreased and, further, a heat transfer amount of heat transferred to the heat radiation fin 200 mounted at the position disposed adjacently to the resin 40 via the resin 40 can be increased. As a result, heat from the chips can be efficiently discharged to the outside and hence, the junction temperatures of the respective chips can be lowered.

In the semiconductor apparatus according to the embodiment 1, the cutouts 52a, 52b are formed at the positions where the current paths through which a current flows in the first inner leads 16a, 16b are formed into a crank shape and hence, the current paths are elongated whereby heat resistances of the first inner leads 16a, 16b are further increased. Accordingly, it is possible to further effectively prevent heat from the chips ch3 to ch4 (particularly ch1, ch2, ch4) from being transferred to the respective external terminals T1, T4 more than necessary.

In the semiconductor apparatus according to the embodiment 1, with respect to the respective external terminals T1 to T4, heat resistances θ between the chips ch1 to ch4 and the external terminals T1 to T4 are equal respectively. Accordingly, irregularities or non-uniformity minimally occurs in the heat transfer amounts of heat from the chips ch3 to ch4 and transferred to the respective external terminals T1 to T4 and hence, it is possible to prevent the specific external terminals (particularly T1, T4) from becoming a high temperature.

In the semiconductor apparatus 1 according to the embodiment 1, thicknesses of the clip leads 30a, 30b are smaller than both thicknesses of the first lead portions 10a, 10b and the thicknesses of the second lead portions 20a, 20b and hence, heat resistances from the chips ch1 to ch4 to the external terminals T2, T3 are increased. As a result, heat from the chips are minimally transferred to the external terminals T2, T3 and hence, it is possible to prevent terminal temperatures of the external terminals T2, T3 from becoming a high temperature and, further, heat which is not transferred can be discharged to the outside by way of the heat radiation fin. Accordingly, heat from the chips can be efficiently discharged to the outside.

The semiconductor apparatus 1 according to the embodiment 1 provides a bride diode suitable for a power source device such as a convertor or an invertor which is liable to generate heat.

The semiconductor apparatus 1 according to the embodiment 1 is the semiconductor apparatus on which four external terminals T1 to T4 are arranged parallel to each other, wherein four chips ch3 to ch4 are provided as the chip, two first lead portions 10a, 10b each having two die pads respectively are provided as the first lead portions, the first lead portion 10a has the portion formed in a U shape by the first inner lead 16a and the die pads 12a, 12c, the first lead portion 10b has a portion formed in a U shape by the first inner lead 16b and the die pads 12b, 12d, the portions formed in the U shape are combined with each other in a staggered manner, and the respective die pads are disposed so as to be disposed in a row along a predetermined direction, and the cutouts 52a, 52b which form the terminal temperature equalizing structures are provided to the first inner leads 16a, 16b of two first lead portions 10a, 10b. With such a configuration, the bridge diode can be formed in a relatively miniaturized package, and a distance between the chip and the external terminal can be shortened and hence, a resistance of the inner lead is decreased whereby a large current is allowed to flow in the semiconductor apparatus 1. Further, the cutouts are formed as the terminal temperature equalizing structures and hence, it is possible to prevent the specific external terminals from becoming a high temperature.

Embodiment 2

Figure 9:
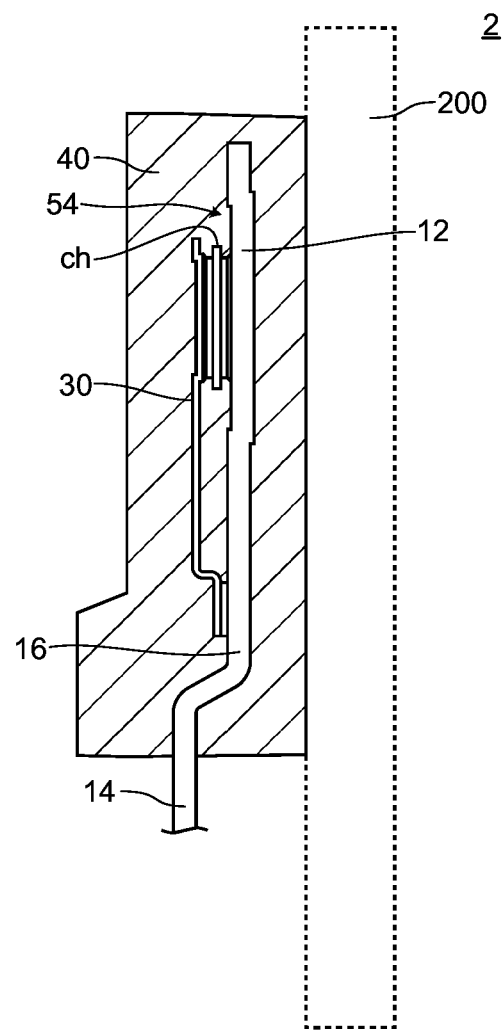
FIG. 9 is a cross-sectional view showing a semiconductor apparatus 2 according to an embodiment 2.

FIG. 9 is a cross-sectional view showing a semiconductor apparatus 2 according to an embodiment 2.

The semiconductor apparatus 2 according to the embodiment 2 basically has substantially the same configuration as the semiconductor apparatus 1 according to the embodiment 1. However, the semiconductor apparatus 2 according to the embodiment 2 differs from the semiconductor apparatus 1 according to the embodiment 1 with respect to the configuration of the terminal temperature equalizing structure. In the semiconductor apparatus 2 according to the embodiment 2, as viewed in cross section, a die pad 12 includes a depressed portion 54 formed so as to position the die pad 12 closer to the heat radiation fin 200 than the first inner lead 16 on a side where the heat radiation fin 200 is mounted (see FIG. 9).

The semiconductor apparatus 2 according to the embodiment 2 differs from the semiconductor apparatus 1 according to the embodiment 1 with respect to the configuration of the terminal temperature equalizing structure as described above. However, in the same manner as the semiconductor apparatus 1 according to the embodiment 1, the terminal temperature equalizing structure which equalizes heat transfer amounts of heat from chips ch and transferred to the respective external terminals is formed on the first inner leads 16 and the die pads 12. Accordingly, irregularities or non-uniformity of heat transfer amounts of heat from the chips ch to the respective external terminals can be prevented whereby it is possible to prevent the specific external terminals from becoming a high temperature. As a result, when the semiconductor apparatus is mounted on a substrate, it is possible to prevent the occurrence of a defect at a connecting portion between the specific external terminals and the substrate.

In the semiconductor apparatus 2 according to the embodiment 2, in a state where the heat radiation fin 200 is mounted on the semiconductor apparatus 2, as viewed in cross section, a die pad 12 includes a depressed portion 54 formed so as to position the die pad 12 closer to the heat radiation fin 200 than the first inner lead 16 on a side where the heat radiation fin 200 is mounted. Accordingly, a heat resistance between a chip ch and the heat radiation fin 200 can be further decreased and hence, heat generated in the chips ch can be more efficiently discharged from the heat radiation fin 200.

The semiconductor apparatus 2 according to the embodiment 2 has substantially the same configuration as the semiconductor apparatus 1 according to the embodiment 1 except for the configuration of the terminal temperature equalizing structure and hence, the semiconductor apparatus according to the embodiment 2 directly acquires the corresponding advantageous effects found amongst all advantageous effects which the semiconductor apparatus 1 according to the embodiment 1 acquires.

Embodiment 3

Figure 10A:
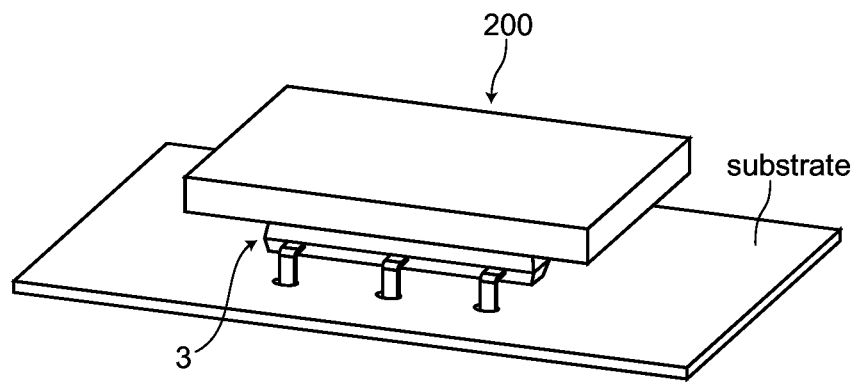
FIG. 10A and FIG. 10B are views for describing a semiconductor apparatus 3 according to an embodiment 3.
Figure 10B:
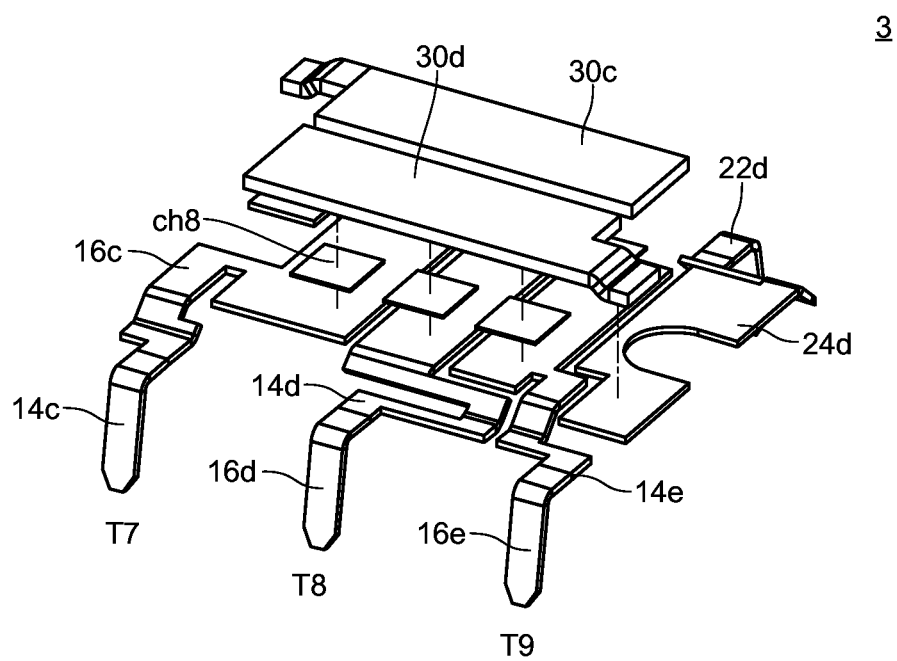
Figure 11:
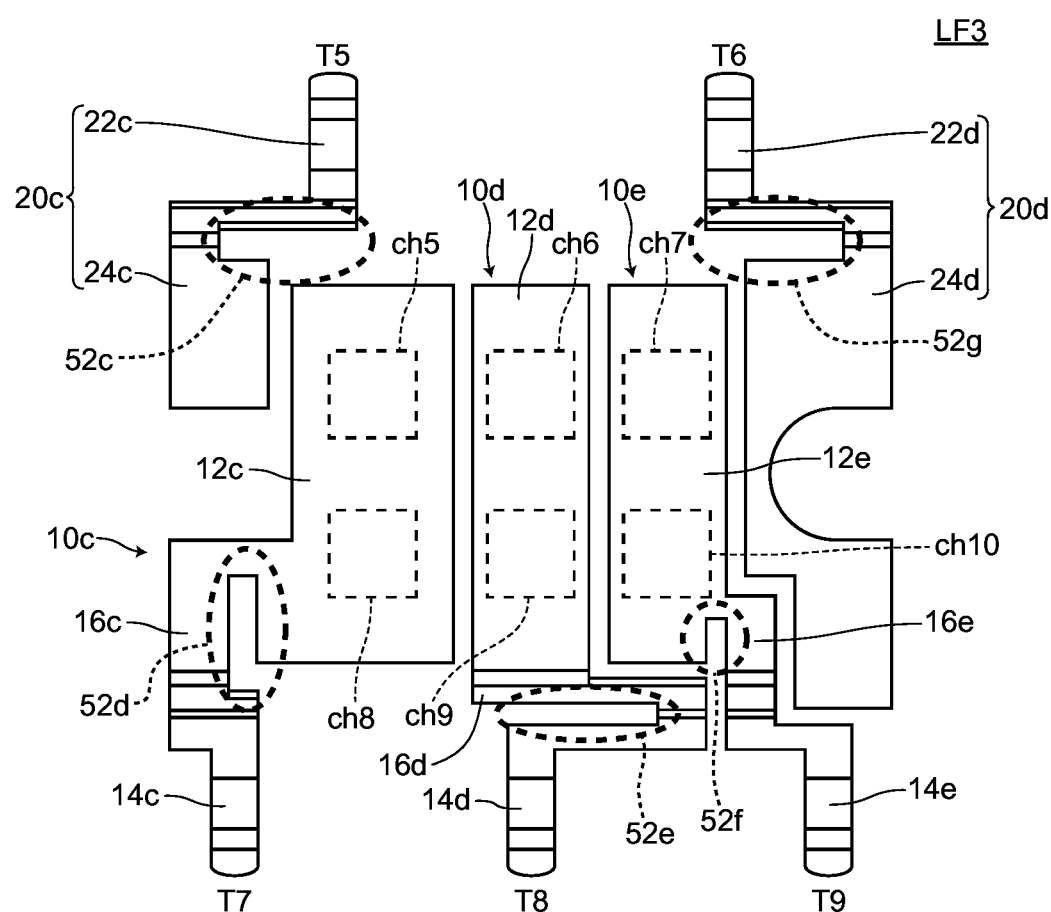
FIG. 11 is a view for describing a lead frame LF3 according to the embodiment 3.

FIG. 10A and FIG. 10B are views for describing a semiconductor apparatus 3 according to an embodiment 3. FIG. 10A is a view showing an in-use state of the semiconductor apparatus 3, and FIG. 10B is a view showing an internal structure of the semiconductor apparatus 3. FIG. 11 is a view for describing a lead frame LF3 according to the embodiment 3.

The semiconductor apparatus 3 according to the embodiment 3 basically has substantially the same configuration as the semiconductor apparatus 1 according to the embodiment 1. However, the semiconductor apparatus 3 according to the embodiment 3 differs from the semiconductor apparatus 1 according to the embodiment 1 with respect to a point that five external terminals are disposed. The semiconductor apparatus 4 according to the embodiment 4 is a three-phase bridge diode where five external terminals T5 to T9 are disposed (see FIG. 10A and FIG. 10B and FIG. 11).

In the semiconductor apparatus 3 according to the embodiment 3, six chips ch5 to ch10 are provided as a chip. Three first lead portions (first lead portions 10c, 10d and 10e) on each of which two die pads are formed are provided as a first lead portion 10. Second lead portions 20d, 20e are provided as a second lead portion. A second inner lead 24d is connected to the chip ch5 of the first lead portion 10c, the chip ch6 of the first lead portion 10d and the chip ch7 of the first lead portion 10e via a clip lead 30c. A second inner lead 24e is connected to the chip ch8 of the first lead portion 10c, the chip ch9 of the first lead portion 10d, and the chip ch10 of the first lead portion 10e via a clip lead 30d. All of the first inner leads 16c, 16d and 16e and all of the second inner leads 24c, 24d are respectively provided with cutouts 52c, 52d, 52e, 52f, 52g which form the terminal temperature equalizing structure.

In such a configuration, the respective external terminals T5 to T9 have equal "chip external-terminal heat resistance θ".

In this manner, the semiconductor apparatus 3 according to the embodiment 3 differs from the semiconductor apparatus 1 according to the embodiment 1 with respect to a point that five external terminals are disposed. However, the terminal temperature equalizing structure which equalizes heat transfer amounts of heat generated from the chips transferred to respective external terminals are formed on the first inner leads 16c, 16d and 16e and the second inner leads 24c, 24d. Accordingly, it is possible to prevent the occurrence of irregularities or non-uniformity in the heat transfer amounts of heat from the chips to the respective external terminals and hence, it is possible to prevent the specific external terminals from becoming a high temperature. As a result, when the semiconductor apparatus is mounted on the substrate, it is possible to prevent the occurrence of a defect at the connecting portions between the specific external terminals and the substrate.

The semiconductor apparatus 3 according to the embodiment 3 has substantially the same configuration as the semiconductor apparatus 1 according to the embodiment 1 except for a point that five external terminals are disposed and hence, the semiconductor apparatus 3 according to the embodiment 3 directly acquires the corresponding advantageous effects found amongst all advantageous effects which the semiconductor apparatus 1 according to the embodiment 1 acquires.

Embodiment 4

Figure 12:
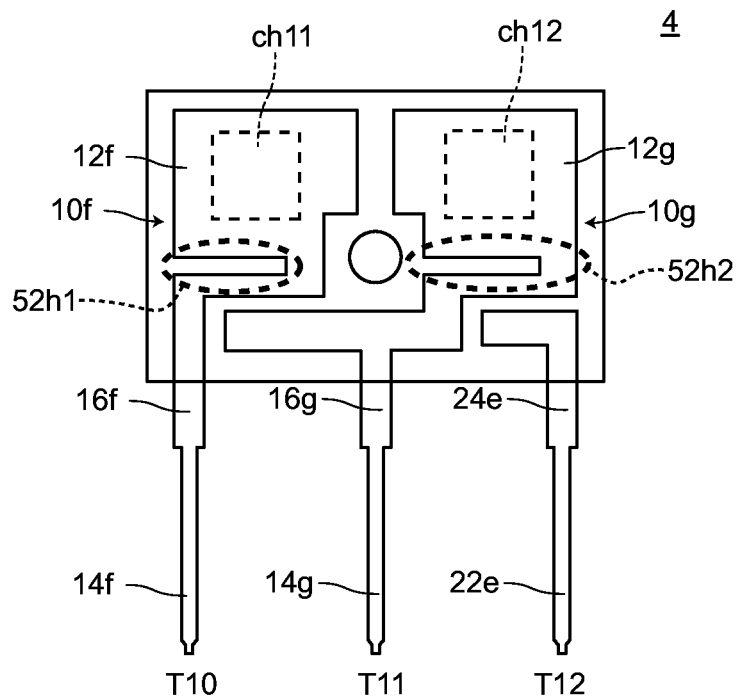
FIG. 12 is a view for describing a semiconductor apparatus 4 according to an embodiment 4.

FIG. 12 is a view for describing a semiconductor apparatus 4 according to an embodiment 4. In FIG. 12, the description of clip leads and chips is omitted.

The semiconductor apparatus 4 according to the embodiment 4 basically has substantially the same configuration as the semiconductor apparatus 1 according to the embodiment 1. However, the semiconductor apparatus 4 according to the embodiment 4 differs from the semiconductor apparatus 1 according to the embodiment 1 with respect to a point that three external terminals are disposed. The semiconductor apparatus 4 according to the embodiment 4 is, as shown in FIG. 12, a bridge diode where three external terminals T10 to T12 are arranged parallel to each other.

In the semiconductor apparatus 4 according to the embodiment 4, two chip, that is, the chips ch11, ch6 are provided as chips. A first lead portion 10f which has a die pad 12f and a first lead portion 10g which has a die pad 12g are provided as first lead portions. One second lead portion 20e is provided as a second lead portion. Cutouts 52h1, 52h2 which function as a terminal temperature equalizing structure are provided respectively to first inner leads 16f, 16g of two first lead portions 10f, 10g.

In such a configuration, the external terminals T10 to T12 each have the same "heat resistance θ between a chip and an external terminal".

In this manner, the semiconductor apparatus 4 according to the embodiment 4 differs from the semiconductor apparatus 1 according to the embodiment 1 with respect to a point that three external terminals are disposed. However, in the same manner as the semiconductor apparatus 1 according to the embodiment 1, in the semiconductor apparatus 4 according to the embodiment 4, the cutouts 52h1, 52h2 which respectively function as a terminal temperature equalizing structure which equalizes heat transfer amounts of heat generated from the chips and transferred to the respective external terminals are formed on the first inner leads 16f, 16g. Accordingly, it is possible to prevent the occurrence of irregularities or non-uniformity in the heat transfer amounts of heat from the chips to the respective external terminals and hence, it is possible to prevent the specific external terminals from becoming a high temperature. As a result, when the semiconductor apparatus is mounted on the substrate, it is possible to prevent the occurrence of a defect at the connecting portions between the specific external terminals and the substrate.

The semiconductor apparatus 4 according to the embodiment 4 has substantially the same configuration as the semiconductor apparatus 1 according to the embodiment 1 except for a point that three external terminals are disposed and hence, the semiconductor apparatus 4 according to the embodiment 4 directly acquires the corresponding advantageous effects found amongst all advantageous effects which the semiconductor apparatus 1 according to the embodiment 1 acquires.

Although the present invention has been described with reference to the above-mentioned embodiments, the present invention is not limited to the above-mentioned embodiments, and the present invention can be carried out in various modes without departing from the gist of the present invention. For example, the following modifications are conceivable.

(1) Materials, shapes, positions, sizes and the like described in the above-mentioned embodiments are provided for an exemplifying purpose, and can be changed within a range that advantageous effects of the present invention are not impaired.

Figure 13:
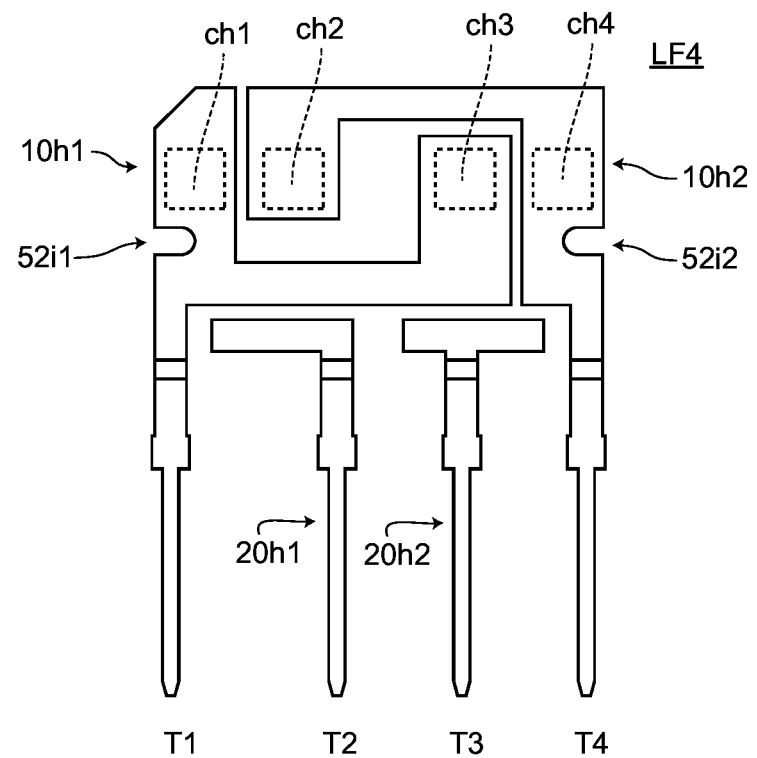
FIG. 13 is a view for describing a lead frame LF4 of a semiconductor apparatus according to a modification 1.
Figure 14:
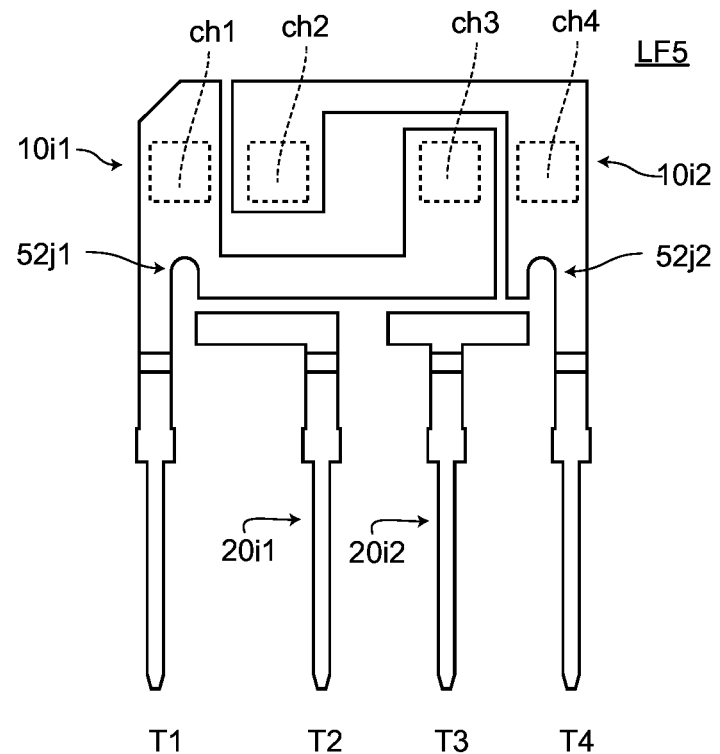
FIG. 14 is a view for describing a lead frame LF5 of a semiconductor apparatus according to a modification 2.

(2) In the above-mentioned respective embodiments, a rectangular cutout is formed as a cutout. However, the present invention is not limited to such a cutout. A cutout having rounded corner portions may be formed as the cutout (see FIG. 13 and FIG. 14).

Figure 15:
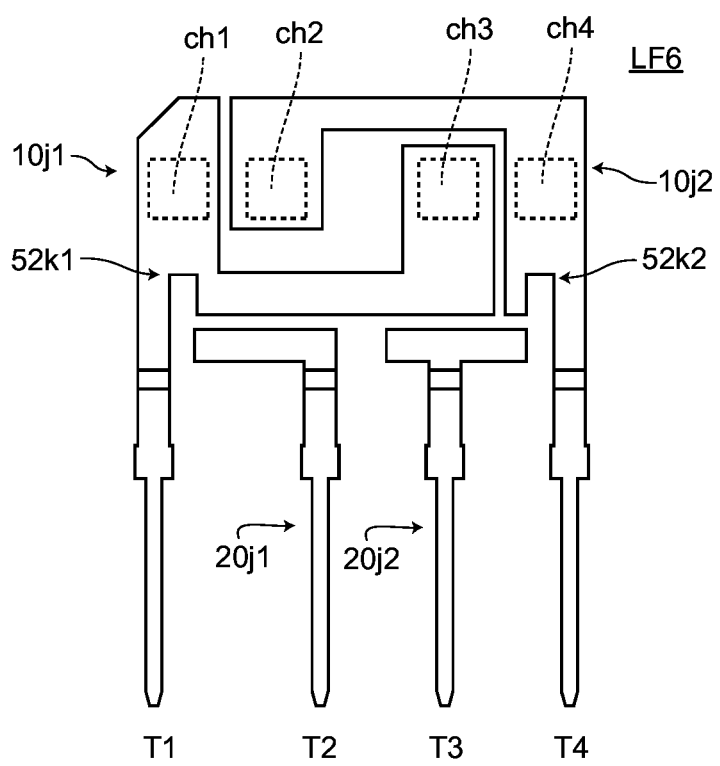
FIG. 15 is a view for describing a lead frame LF6 of a semiconductor apparatus according to a modification 3.
Figure 16:
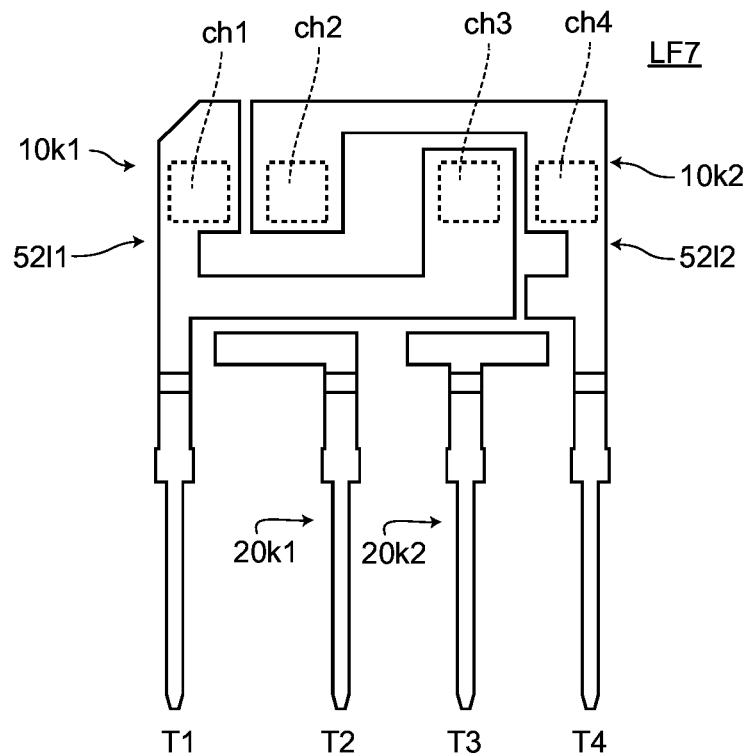
FIG. 16 is a view for describing a lead frame LF7 of a semiconductor apparatus according to a modification 4.

(3) In the above-mentioned respective embodiments, the cutout is formed from an outer side surface of the first inner lead in a lateral direction. However, the present invention is not limited to such a cutout. The cutout may be formed from an inner side surface of the first inner lead in the lateral direction (see FIG. 16), or the cutout may be formed in a vertical direction of the first inner lead (a direction parallel to a direction that the outer lead extends (see FIG. 14 and FIG. 15).

Figure 17:
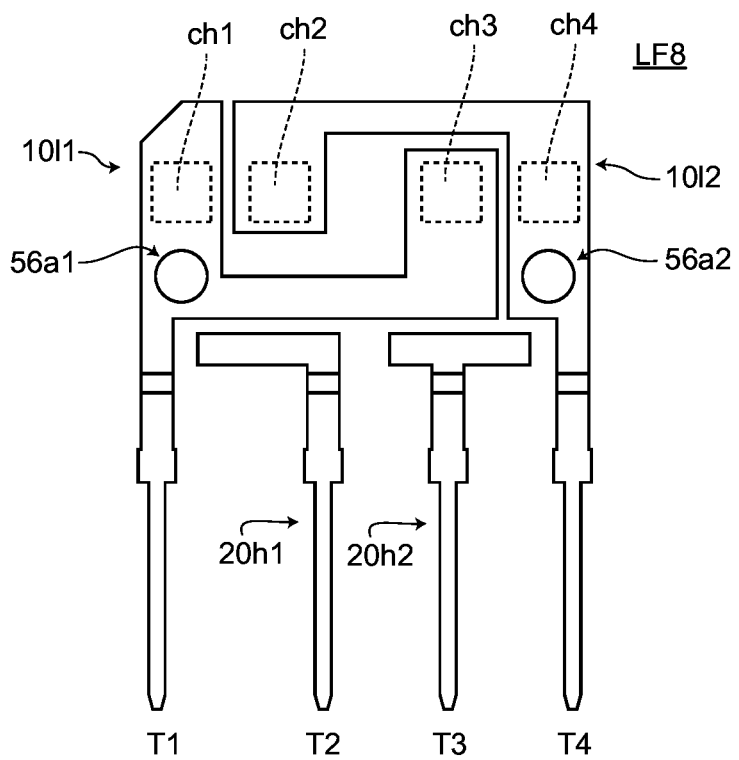
FIG. 17 is a view for describing a lead frame LF8 of a semiconductor apparatus according to a modification 5.
Figure 18:
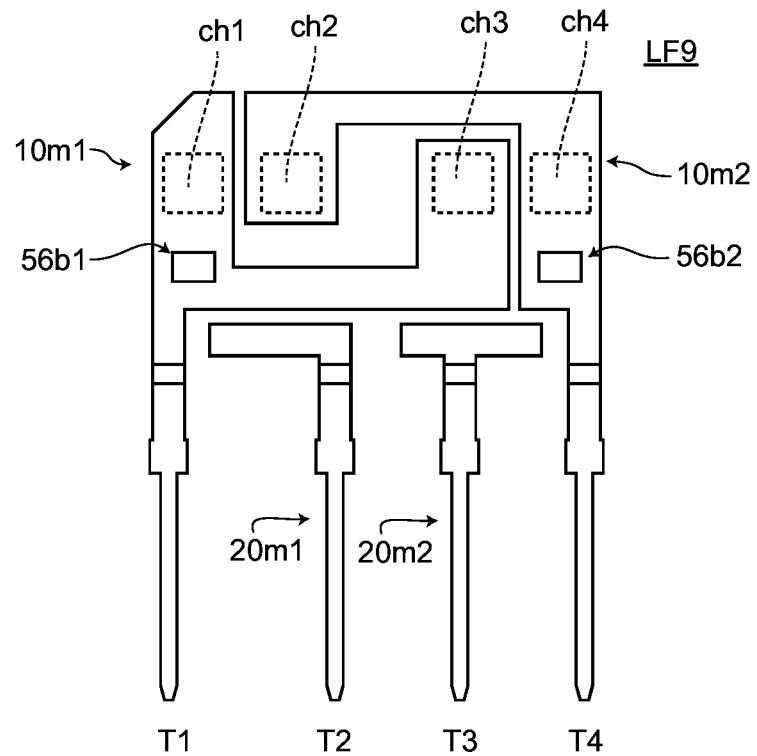
FIG. 18 is a view for describing a lead frame LF9 of a semiconductor apparatus according to a modification 6.
Figure 19:
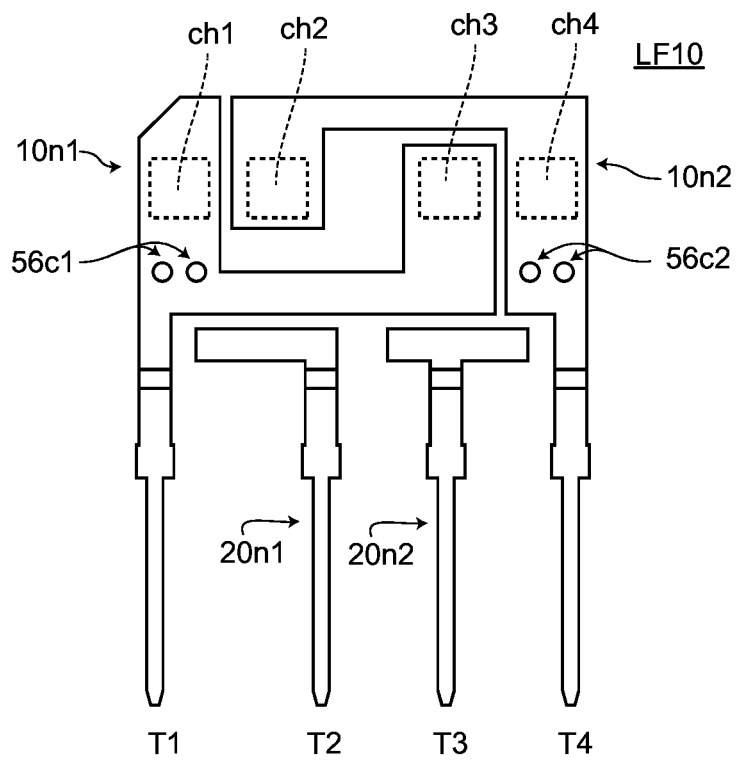
FIG. 19 is a view for describing a lead frame LF10 of a semiconductor apparatus according to a modification 7.
Figure 20:
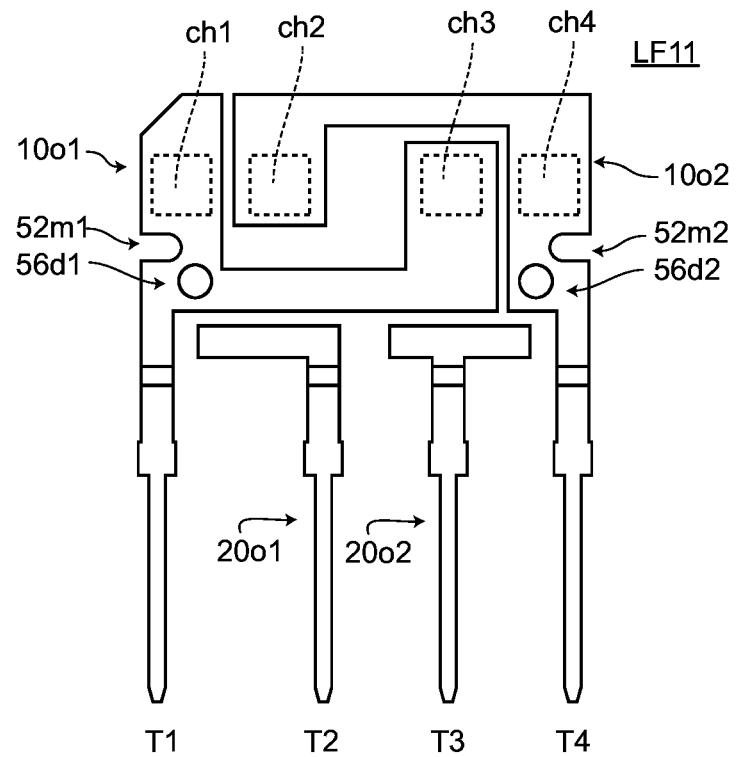
FIG. 20 is a view for describing a lead frame LF11 of a semiconductor apparatus according to a modification 8.
Figure 21:
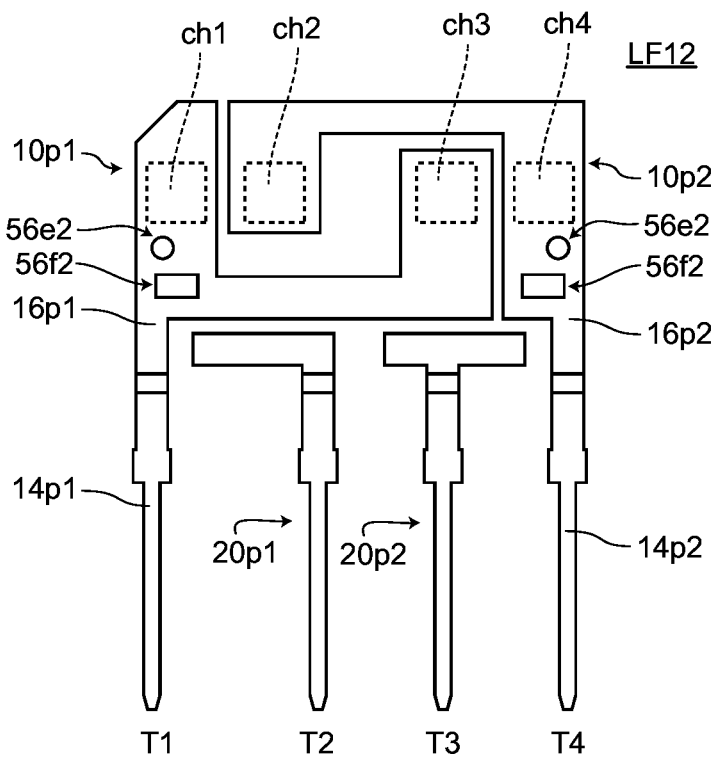
FIG. 21 is a view for describing a lead frame LF12 of a semiconductor apparatus according to a modification 9.
Figure 22:
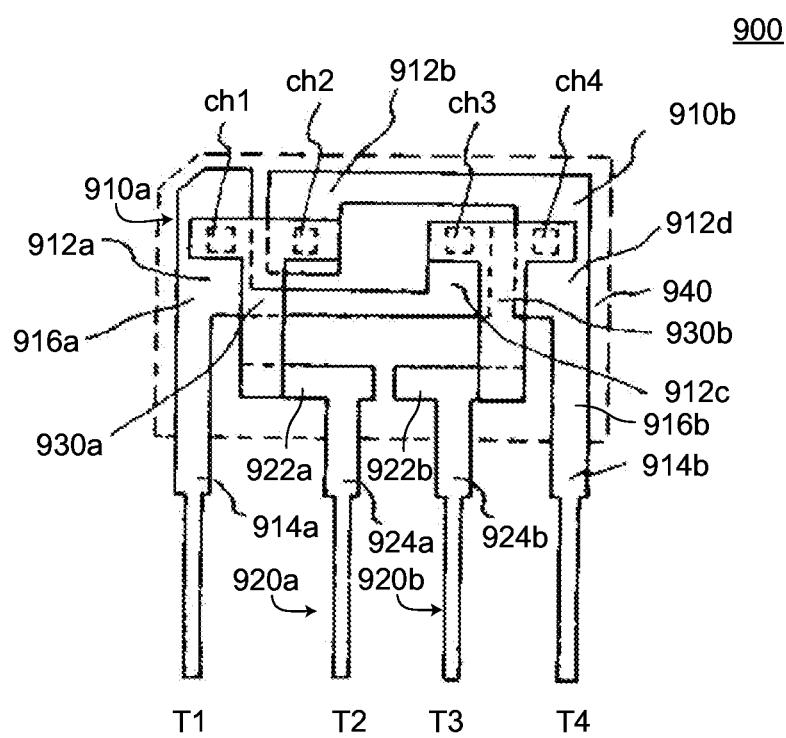
FIG. 22 is a cross-sectional view showing a conventional semiconductor apparatus 900.

(4) In the above-mentioned respective embodiments, the cutout is formed as the terminal temperature equalizing structure. However, the present invention is not limited to such a cutout. A hole may be formed as the terminal temperature equalizing structure. In this case, the shape of the hole may be a rectangular shape (see FIG. 18), a circular shape (see FIG. 17 and FIG. 19) or other suitable shapes. Further, the number of holes may be one or plural (see FIG. 19 and FIG. 21). Further, the cutout and the hole may be combined to each other (see FIG. 20). Further, as the terminal temperature equalizing structure, a structure other than a cutout or a hole (for example, a structure where a thickness of only a predetermined portion of the inner lead is small, or a structure where the inner lead is bent in a height direction of the chip or the like) may be formed.

(5) In the above-mentioned respective embodiments, the present invention adopts the bridge diode as the semiconductor apparatus. However, the present invention is not limited to such a bridge diode. The present invention may adopt a suitable semiconductor apparatus such as a MOSFET, an IGBT, various diodes, a thyristor or a triac.

The invention claimed is:

1. A semiconductor apparatus provided with a plurality of external terminals, the semiconductor apparatus comprising:
    a first lead portion including: a die pad, a first outer lead forming an outermost one of the plurality of external terminals arranged in a predetermined direction, and a first inner lead connecting the die pad and the first outer lead to each other;
    a chip mounted on the die pad connecting to the first outer lead, the chip having a surface electrode on a surface of the chip on a side opposite to a die pad side;
    a second lead portion including: a second outer lead forming another external terminal of the plurality of external terminals, and a second inner lead being connected to the surface electrode via a clip lead;
    a resin sealing the die pad, the first inner lead, the chip and the second inner lead, a heat radiation fin being mountable on the semiconductor apparatus at a position adjacently to the resin; and a terminal temperature equalizing structure having a cutout or a hole in the first inner lead between the die pad and the first outer lead forming the outermost one of the plurality of external terminals, the terminal temperature equalizing structure being configured to restrict a heat transfer amount of heat from the chip to the outermost one of the plurality of external terminals and equalize respective terminal temperatures of the plurality of external terminals.

2. The semiconductor apparatus according to claim 1, wherein the cutout or the hole is at a position where a current path through which a current flows in the first inner lead or the second inner lead is formed into a roundabout path.

3. The semiconductor apparatus according to claim 2, wherein the cutout or the hole is at a position where the current path through which the current configured to flow in the first inner lead or the second inner lead is in a crank shape.

4. The semiconductor apparatus according to claim 1, wherein a thickness of the clip lead is smaller than both a thickness of the first lead portion and a thickness of the second lead portion.

5. The semiconductor apparatus according to claim 1, wherein assuming a heat resistance between one of the plurality of external terminals and one chip which forms the chip connected to the external terminal as a chip external-terminal heat resistance $\theta$ when one of the plurality of external terminals is connected to the one chip, and assuming a sum of heat resistances between one of the plurality of external terminals and two or more chips which form the chip connected to the one of the plurality of external terminals as the chip external-terminal heat resistance $\theta$ when one of the plurality of external terminals is connected to the two or more chips, the chip external-terminal heat resistances $\theta$ are equal among the respective external terminals.

6. The semiconductor apparatus according to claim 1, wherein as viewed in a cross section, the die pad includes a depressed portion for positioning the die pad closer to the heat radiation fin than the first inner lead on a side where the heat radiation fin is located.

7. The semiconductor apparatus according to claim 1, wherein the semiconductor apparatus is a bridge diode.

8. The semiconductor apparatus according to claim 1, wherein the plurality of external terminals are four external terminals arranged parallel to each other, four chips are provided as the chip, two first lead portions each having two die pads are provided as the first lead portion, the two first lead portions each have a portion formed in a U shape by the first inner lead and the two die pads, and the portions which are formed in a U shape are combined with each other in a staggered manner, and the respective die pads are disposed in a row along a predetermined direction, and the cutout or the hole is formed in both the first inner leads of the two first lead portions.

9. The semiconductor apparatus according to claim 1, wherein the plurality of external terminals are three external terminals arranged parallel to each other, two chips are provided as the chip, two first lead portions each having one die pad are provided as the first lead portion, one second lead portion is provided as the second lead portion, and the cutout or the hole is formed in all of the first inner leads of the two first lead portions and the second inner lead of the second lead portion.

10. A lead frame comprising the first lead portion and the second lead portion used in the semiconductor apparatus according to claim 1.

11. A power source apparatus comprising the semiconductor apparatus according to claim 1.

12. The semiconductor apparatus according to claim 1, wherein the first lead portion further includes:
another die pad,
another first outer lead forming another outermost one of the plurality of external terminals in the predetermined line, and
another first inner lead connecting another die pad and another first outer lead to each other;

another chip mounted on another die pad connecting to another first outer lead, another chip having a surface electrode on a surface of the chip on a side opposite to a die pad side; wherein another terminal temperature equalizing structure having another cutout or another hole in another first inner lead between another die pad and another first outer lead forming the outermost one of the plurality of external terminals, the terminal temperature equalizing structure being configured to restrict a heat transfer amount of heat from another chip to another outermost one of the plurality of external terminals and equalize respective terminal temperatures of the plurality of external terminals.

13. The semiconductor apparatus according to claim 1, wherein the first outer lead and the die pad are in a direction perpendicular to the predetermined direction in which the plurality of the external terminals is arranged.

14. A semiconductor apparatus provided with a plurality of external terminals, the semiconductor apparatus comprising:

a first lead portion including: a die pad, a first outer lead forming one of the plurality of external terminals, and a first inner lead connecting the die pad and the first outer lead to each other;

a chip mounted on the die pad, a surface electrode being formed on a surface of the chip on a side opposite to a die pad side;

a second lead portion including: a second outer lead forming another external terminal of the plurality of external terminals, and a second inner lead being connected to the surface electrode via a clip lead; and a resin sealing the die pad, the first inner lead, the chip and the second inner lead, a heat radiation fin being mountable on the semiconductor apparatus at a position disposed adjacently to the resin, wherein a terminal temperature equalizing structure which restricts a heat transfer amount of heat from the chip to a predetermined external terminal of the plurality of external terminals and equalizes respective terminal temperatures of the plurality of external terminals is formed on at least one of the first inner lead and the second inner lead, wherein the terminal temperature equalizing structure has a cutout or a hole formed in at least one of the first inner lead and the second inner lead, and the plurality of external terminals are five external terminals, six chips are provided as the chip, three first lead portions each having two die pads are provided as the first lead portion, two second lead portions are provided as the second lead portion, the respective second inner leads are connected to any one of two chips mounted on the respective first lead portions via the clip lead, and the cutout or the hole is formed in all of the first inner leads of the three first lead portions, and the second inner leads of the two second lead portions.

* * * * *